United States Patent
Dong

(10) Patent No.: US 7,414,419 B2
(45) Date of Patent: *Aug. 19, 2008

(54) MICRO-ELECTROMECHANICAL PROBE CIRCUIT SUBSTRATE

(76) Inventor: Wen-Chang Dong, No. 15-4, Manping 2nd St., Banciao City, Taipei County (TW) 220

( * ) Notice: Subject to any disclaimer, the term of this patent is extended or adjusted under 35 U.S.C. 154(b) by 0 days.

This patent is subject to a terminal disclaimer.

(21) Appl. No.: 11/411,125

(22) Filed: Apr. 26, 2006

(65) Prior Publication Data

US 2006/0244468 A1 Nov. 2, 2006

(30) Foreign Application Priority Data

Apr. 29, 2005 (TW) ............................... 94206913 U

(51) Int. Cl.
*G01R 31/02* (2006.01)
(52) U.S. Cl. ...................... 324/754; 324/761
(58) Field of Classification Search ................. 438/106; 324/762, 754
See application file for complete search history.

(56) References Cited

U.S. PATENT DOCUMENTS

| | | | | |
|---|---|---|---|---|
| 5,134,365 A | * | 7/1992 | Okubo et al. | 324/754 |
| 5,412,329 A | * | 5/1995 | Iino et al. | 324/754 |
| 5,559,446 A | * | 9/1996 | Sano | 324/760 |
| 5,989,936 A | * | 11/1999 | Smith et al. | 438/106 |
| 6,330,744 B1 | * | 12/2001 | Doherty et al. | 29/825 |
| 6,499,216 B1 | * | 12/2002 | Fjelstad | 29/842 |
| 6,690,186 B2 | * | 2/2004 | Fjelstad | 324/762 |
| 7,245,135 B2 | * | 7/2007 | Ismail et al. | 324/754 |
| 2004/0232931 A1 | * | 11/2004 | Crippen | 324/754 |
| 2006/0091510 A1 | * | 5/2006 | Liu et al. | 257/678 |
| 2006/0186906 A1 | * | 8/2006 | Bottoms et al. | 324/754 |
| 2006/0238209 A1 | * | 10/2006 | Chen et al. | 324/754 |

* cited by examiner

*Primary Examiner*—Paresh Patel
(74) *Attorney, Agent, or Firm*—Bacon & Thomas PLLC

(57) ABSTRACT

A MEMPCS having high stiffness against bending deformation or distortion is formed by integrating the probe, electronic circuit, circuit connecting pad and dielectric material into a complete unit with flexible multiple-layered substrate structure, and the part of the probe extended outside the dielectric material is further wrapped with a protecting layer to form an reinforced structure for increasing high stiffness to the probe and for preventing environmental dirt and particle from getting into the gap existed between the probes of the MEMPCS.

6 Claims, 3 Drawing Sheets

MICRO-ELECTROMECHANICAL PROBE CIRCUIT SUBSTRATE

BACKGROUND OF THE INVENTION

1. Field of the Invention

The invention relates to a micro-electromechanical probe circuit substrate, particularly the micro-electromechanical probe circuit substrate (hereinafter referred to as MEMPCS) formed by having the probe, electronic circuit, circuit connecting pad and dielectric material integrated into a flexible multiple-layered substrate structure.

2. Description of the Prior Art

As shown in FIG. 1, the prior known probe circuit substrate 10 is provided with a flexible circuit substrate or soft sheet plate 11, and on the surface of the circuit substrate or the soft sheet plate 11 has the printed circuit (not shown), circuit connecting pads 12, and the metal probes 13 fixed on the circuit connecting pad 12 to form an electronic connection with the printed circuit and the circuit connecting pad 12.

However, since the prior known probe circuit substrate 10 has no protecting structure to wrap the probes 13 to improve its structure strength, the probes 13 is only supported by the joining strength between the bottom side of the probe 13 and the surface of the circuit substrate or the soft sheet plate 11, therefore, the structural strength of the probe 13 of the probe circuit substrate 10 is considerably unstable. Once load is applied on the probe 13 of the probe circuit substrate 10, slanting deformation or sinking to the probes 13 shall always be resulted in as shown in FIG. 1 that will cause distortion of signal transmitting when the probe circuit substrate is in practical use.

SUMMARY OF THE INVENTION

In view of the above, the major purpose of the invention is to provide a micro-electromechanical probe circuit substrate (MEMPCS) comprising a flexible dielectric material to integrate one or more probes, one or more electronic circuits and one or more circuit connecting pads to form a whole unit with multiple-layered substrate structure, and enables the MEMPCS to possess high resistance against bending deformation and to obtain high flatness.

The features of the MEMPCS include a multiple-layered substrate structure formed with flexible dielectric material inside which electronic circuit is formed, and the probe is connected to the electronic circuit inside the dielectric material to form an electric connection while another end of the probe extends to outside of the dielectric material and is wrapped with a protecting layer that enables only the tip portion of the probe exposed outside the protecting layer. The special designed structure enables the MEMPCS to possess the high strength against side bending deformation, and the effect of preventing environmental dirt and particle from getting into the gap between probes, because environmental dirt and particle always cause distortion of signal transmitting.

Another feature of the MEMPCS is that the electronic circuit formed inside the dielectric material can be arranged into multiple-layers of electronic circuit, and each of the electronic circuit layers can carry resistor, capacitor, inductor or other electronic elements, particularly between the layers of electronic circuit a grounding layer can be arranged to prevent interference.

Another further feature of the MEMPCS is that a probe supporter can be provided on the back side of the flexible dielectric material which is served as an elastic cushion effect to the probe exposed opposite side of the dielectric material to maintain to the desired flatness for the probe of the MEMPCS.

DETAILED DESCRIPTION OF THE INVENTION

Figure 1:
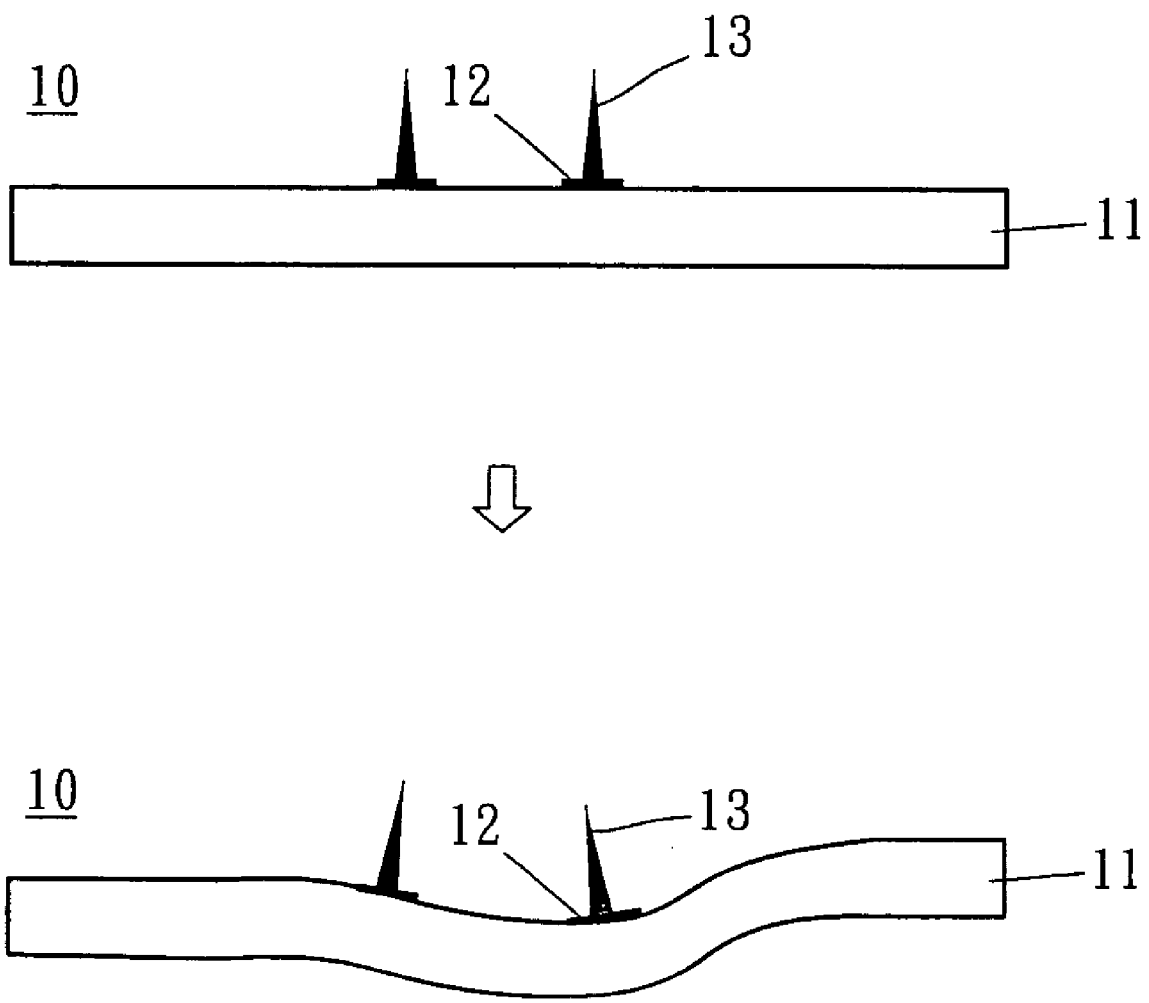
FIG. 1 is a schematic drawing of a known probe circuit substrate to illustrate whose probes is easily sunk to deformation when load is applied on the probe circuit substrate.
Figure 2:
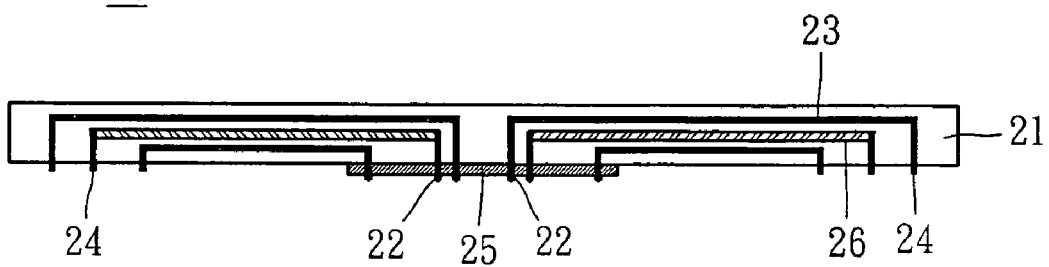
FIG. 2 is a schematic drawing of the structure of the MEMPCS disclosed in the invention.
Figure 3:
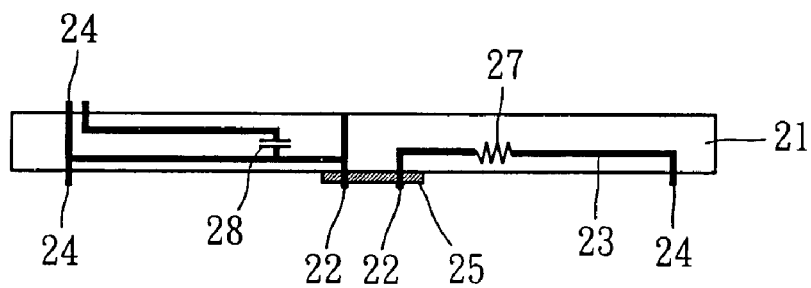
FIGS. 3 to 5 are the schematic drawings showing the structure of other examples of embodiment of the MEMPCS disclosed in the invention.
Figure 4:
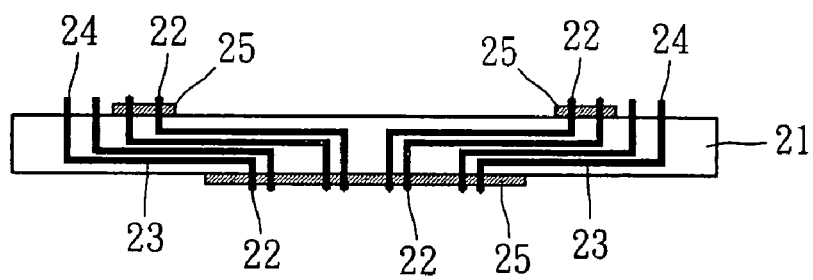

As shown in FIGS. 2 to 4, the micro-electromechanical probe circuit substrate (MEMPCS) 20 of the invention is formed by laminating dielectric materials 21 to form a multiple-layered substrate structure which has characteristics of high strength against bending deformation and distortion as well as high flatness. Particularly, the MEMPCS 20 of the invention has the micro-electromechanical components of probe 22, electronic circuit 23 and circuit connecting pad 24 which are integrally arranged inside the dielectric material 21 to form a complete unit of multiple-layered substrate structure.

Accordingly, the basic structure of the MEMPCS 20 of the invention at least comprises a probe 22, an electronic circuit 23, a circuit connecting pad 24 and a dielectric material 21, wherein the electronic circuit 23 is arranged inside the dielectric material 21, and, the probe 22 and the circuit connecting pad 24 can be arranged on one side or both sides and connected to the electronic circuit 23 being buried inside the dielectric material 21 to form an electric connection.

The structure of the probe 22 of the MEMPCS 20 of the invention has the features of having one end of the probe 22 buried inside the dielectric material 21, and tightly wrapped with the dielectric material 21, therefore, in addition to the effect of forming the supporting structure to wrap and support the probe 22 the dielectric material 21 of the MEMPCS 20 also forms the protecting structure for preventing damage of probe 22.

Particularly, although the upper end of the probe 22 extends to outside of the dielectric material 21, the lower part of the upper end of the probe 22 extended outside the dielectric material 21 is further wrapped with a protecting layer 25 to form an reinforced structure by only having the tip portion of the probe 22 being exposed outside the protecting layer 25.

This reinforced structure of protecting layer 25 can enable high stiffness of the probe 22 against side bending deformation as well as the effect of preventing the environmental dirt and particle from getting into the gap between the probes 22 to avoid distortion of signal transmitting when the MEMPCS 20 of the invention is in practical use, and increasing the stiffness of the probe 22.

The MEMPCS 20 of the invention can be designed to have different kinds of electronic circuit 23 arranged inside the dielectric 21. As illustrated in FIG. 3, the electronic circuit 23 of the MEMPCS 20 carries resistor 27 and capacitor 28 to increase useful functions of the MEMPCS 20.

Further, as illustrated in FIG. 2 or 4, the electronic circuit 23 of the MEMPCS 20 of the invention can be arranged into multiple-layers of electronic circuit 23 and formed inside the dielectric material 21, in addition, between the layers of electronic circuit 23 of the MEMPCS 20 of the invention a grounding layer 26 is arranged to isolate the electronic circuits 23 from each other to avoid electrical interference.

As illustrated in FIG. 3, the circuit connecting pad 24 of the MEMPCS 20 of the invention can be arranged to penetrate or not to penetrate the MEMPCS 20. And, as depicted in FIG. 2 or 4, the tip portion of probe 22 of the MEMPCS 20 of the invention and the circuit connecting pad 24 can be arranged on the same side or different side of the MEMPCS 20.

Figure 5:
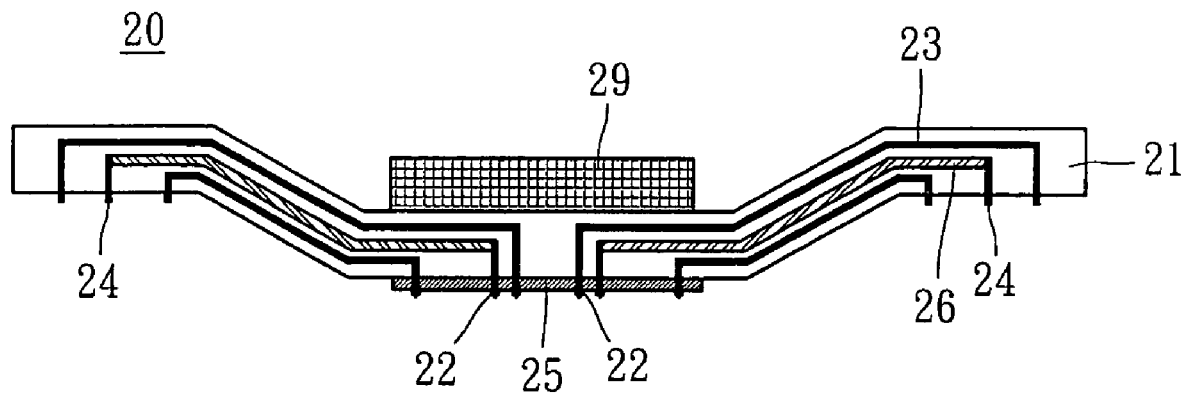

Shown in FIG. 5 is another example of embodiment of the MEMPCS 20 of the invention which has a protrudent probe supporterer 29 located at a position on the back side corresponding to the side and position the probes 22 are formed. The major purpose of having the probe supporter 29 is for maintaining the tips of probes 22 in the desired flatness, and the minor purpose is to provide an elastic cushion effect for the probe 22, and make the tip portion of probe 22 at a position higher than other surface when in practical application.

As concluded above, the MEMPCS 20 of the invention has the following advantages:
1. The micro-electromechanical components, such as probe 22, circuit connecting pad 24, and the electronic circuit 23 which carries resistor, capacitor, inductor or other electronic elements, can be formed into a complete unit of MEMPCS with flexible and integrated structure.
2. Has high flatness of plane formed by probe tips.
3. Probe 22 and circuit connecting pad 24 can be arranged on single side or both sides of the flexible MEMPCS 20 that enables a wide range of application of the invention.
4. Since the probe 22 is structured to extend outside of the MEMPCS 20, a large portion of the probe 22 is wrapped and protected by the dielectric material 21, that increases the stiffness and prevents slanting deformation and damage of the probe 22, particularly, since only the tip portion of the probe 22 is exposed, but other portion is wrapped by a protecting layer 25, the stiffness and the strength against slanting deformation are further improved, and by employing the protecting layer 25 the effect of preventing the environmental dirt or particle from getting into the gap between probes can be achieved.
5. Since the electronic circuit 23 is formed inside the MEMPCS 20 and can be formed into multiple-layered arrangement, the interval between probes is allowed a high density probe layout, particularly can be arranged into matrix form.
6. A grounding layer 26 is provided as a means for preventing interference from occurring in between multiple-layers of electronic circuits 23 of the MEMPCS 20. Therefore, the use of electronic circuit 23 of even higher frequency design is possible.
7. The structure of MEMPCS 20 of the invention can be designed to include a probe supporter 29 which shall be made of elastic material to form elastic cushion structure and serve as a cushion for the probe 22 of the MEMPCS 20. When load is applied on the probe 22, force is transmitted to and absorbed by the probe supporter 29 that enables high durability of the probes 22.

Figure 6:
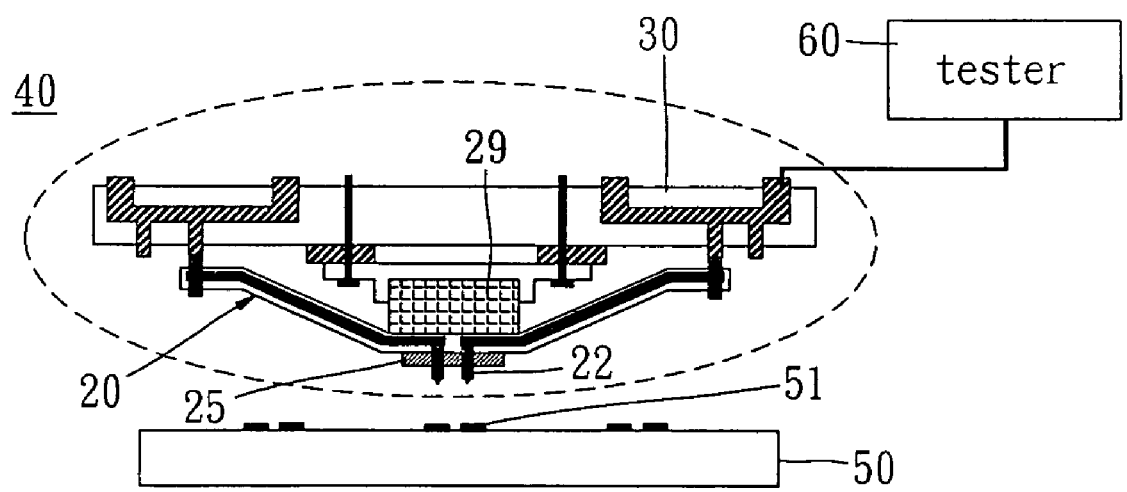
FIG. 6 is a schematic drawing showing that the MEMPCS of the invention applicable for testing a bare chip.

As for the practical application, shown in FIG. 6, a printed circuit 30 provided with testing function and the MEMPCS 20 of the invention can be assembled together to form a micro-electromechanical substrate testing head 40 for testing a bare chip 50.

Especially, by employing the probe supporter 29, the desired relative flatness of the plane formed by the tips of the probes 22 of the MEMPCS 20 can be maintained. Therefore, when the MEMPCS 20 of the invention and the specially designed printed circuit 30 are installed together to form a micro-electromechanical testing head 40, the desired relative flatness of the plane formed by the tips of the probes 22 can be kept unchanged during installation.

When the chip 50 is to be tested, let the probes 22 of the EMEPCS 20 of the invention touch the connecting pad 51 on the chip 50 to form an electric connection and then to enable a circuit formed by the chip 50 and a tester 60.

When the whole system's circuit forms a closed loop, the electric current and signal can be transmitted out from the tester 60, and then transmitted to the tested chip 50 through the probe 22 of the micro-electromechanical testing head 40. After processed by the IC of chip 50, the signal is transmitted back to the tester 60 through the micro-electromechanical testing head 40, and, by reading the returned signal, the tester 60 can decide whether it's a good chip or a defective chip.

While the invention has been described in its preferred form, it is understood that modification or change of any part of the invention which is apparent to those skilled in the art, and falls within the spirit of the invention shall be covered by the claims herein appended.

What is claimed is:

1. A micro-electromechanical probe circuit substrate comprising a flexible dielectric material integrated one or more probes, one or more electronic circuits and one or more circuit connecting pads to form as a multiple-layered substrate structure, and a probe supporter provided on back side of the dielectric material served as an elastic cushion effect to the probe exposed on opposite side of the dielectric material, wherein the electronic circuit is formed inside the flexible dielectric material, the probe and the circuit connecting pad are connected to the electronic circuit to form an electric connection, and the probe is arranged to have one end buried inside and tightly wrapped with the dielectric material and the other end with upper portion extended outside the dielectric material and wrapped with a protecting layer by only having its tip portion exposed outside the protecting layer.

2. The micro-electromechanical probe circuit substrate as described in claim 1, wherein the probes are formed on one side or both sides of the flexible dielectric material.

3. The micro-electromechanical probe circuit substrate as described in claim 1, wherein the circuit connecting pads are formed on one side or both sides of the flexible dielectric material.

4. The micro-electromechanical probe circuit substrate as described in claim 1, wherein the electronic circuits formed inside the dielectric material are arranged into multiple-layers of electric circuit.

5. The micro-electromechanical probe circuit substrate as described in claim 4, wherein a grounding layer for preventing interference is formed between the multiple-layers of electric circuit.

6. The micro-electromechanical probe circuit substrate as described in claim 4, wherein the electronic circuit formed inside the dielectric material carries a resistor, a capacitor, an inductor or an electronic element.

* * * * *